United States Patent [19]

Tsugane

[11] Patent Number: 4,482,886
[45] Date of Patent: Nov. 13, 1984

[54] APPARATUS FOR CONVERTING DIGITAL SIGNALS OF FIRST LENGTH CODE INTO SECOND LENGTH CODES

[75] Inventor: Shuzo Tsugane, Tokyo, Japan
[73] Assignee: Nippon Electric Co., Ltd., Tokyo, Japan
[21] Appl. No.: 366,528
[22] Filed: Apr. 8, 1982
[30] Foreign Application Priority Data Apr. 15, 1981 [JP] Japan ................................. 56-55532

[51] Int. Cl.$^3$ .......................................... H03K 13/24
[52] U.S. Cl. ............................ 340/347 DD; 358/135; 358/261
[58] Field of Search ................ 340/347 DD; 358/133, 358/135, 261

[56] References Cited

U.S. PATENT DOCUMENTS 4,168,513  9/1979  Hains et al. ...................... 358/135 X
4,276,544  6/1981  Tsugane ....................... 340/347 DD Primary Examiner—T. J. Sloyan
Attorney, Agent, or Firm—Blakely, Sokoloff Taylor & Zafman

[57] ABSTRACT

There is provided a code converting circuit for converting digital signals of fixed length codes into variable length codes and delivering a train of variable length codes produced by the conversion parallelly every predetermined K bits. The converting circuit comprises: a variable length code converter for converting an input fixed length code into a variable length code, sending the variable length code to an output signal line of K bits starting from a bit position next to that indicated by the output value of a first flip-flop, and sending an overflowing portion of the variable length code to an overlfow signal line; an adder with a modulo of K for adding the bit number of the variable length code corresponding to the input fixed length code to the output value of the first flip-flop; an OR circuit for receiving the output from the output signal line of the variable length code converter and the output from a second flip-flop; a switching circuit receiving the output signal of said OR circuit and the overflow signal from said variable length code converter and being responsive to a carry signal of the adder to selectively deliver as an output thereof one of the input signals; and a third flip-flop for storing the output signal of said OR circuit and delivering the stored value during the rise of the time slot following the delivery of the carry signal of the adder. The first flip-flop functions to delay the output value of the adder by one time slot and delivers the delayed output to the variable length code converter and the adder. The second flip-flop functions to delay the output signal of the switching circuit by one time slot and delivers the delayed output signal to the OR circuit.

2 Claims, 4 Drawing Figures

FIG.1
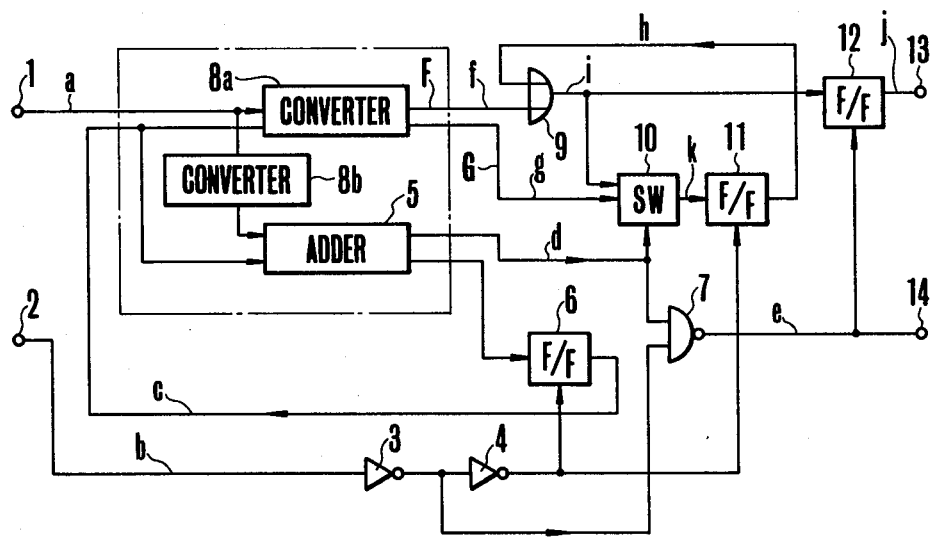
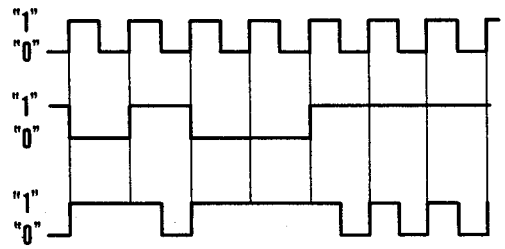
FIG.2A
FIG.2B
FIG.2C

APPARATUS FOR CONVERTING DIGITAL SIGNALS OF FIRST LENGTH CODE INTO SECOND LENGTH CODES

BACKGROUND OF THE INVENTION

This invention relates to a code converting circuit which converts fixed length codes into variable length codes and delivers out a resultant train of variable length codes every K (constant) bits.

For the PCM transmission of signals of a wide bandwidth such as video signals, the concept of lowering the transmission bit rate by converting fixed length codes into variable length codes has been conceived. With the variable length code scheme, the overall bit rate can be drastically lowered by, for example, allocating bits of a short length to codes of frequent occurrence. Practical hardware for this purpose, however, calls for a complicated, large-scale circuitry as disclosed in U.S. Pat. No. 4,276,544 of the same applicant and no simple converting circuit has yet been realized. In effect, the above U.S. patent requires shifters 38 and 42 (FIG. 6) in order to rearrange the variable length code every predetermined bits in parallel, thus increasing the hardware. Therefore, it has been desired to attain the above advantage of the variable length code scheme with a simplified converting circuit.

SUMMARY OF THE INVENTION

It is an object of this invention to provide a simplified code converting circuit capable of realizing the conversion into variable length codes at low cost.

According to the invention, the above object can be accomplished by a code converting circuit for conversion of digital signals of fixed length codes into variable length codes comprising:

means for converting an input fixed length code into a variable length code;

means including first memory means for storage of information concerning the bit number of the variable length code, for causing the converting means to send the variable length code to an output signal line of K bits, starting from a bit position next to that of a different variable length code in the preceding time slot;

second and third memory means for storage of a logical sum of the previously sent variable length code and the presently sent variable length code;

means for causing the content stored in the third memory means to be delivered out in the form of a parallel output signal of K bits during the subsequent time slot when the variable length code overflows, and supplying the overflowing portion of the variable length code to the second memory means; and means for causing the variable length code to be sent from said converting means during the further subsequent time slot, starting from a bit position next to the variable length code stored in the second memory means.

BRIEF DESCRIPTION OF THE DRAWING

FIG. 1 is a block diagram illustrating one embodiment of this invention;

FIGS. 2A, 2B and 2C are time charts of a clock pulse, a carry signal of an adder and an output signal of a NAND circuit in the embodiment in FIG. 1.

DESCRIPTION OF PREFERRED EMBODIMENT

Referring now to FIG. 1, there is shown a code converting circuit embodying the present invention. As shown, a fixed length code a is applied through an input terminal 1 and a clock pulse b synchronized with the input code is applied through a terminal 2. A code converter 8a incorporates a memory capable of converting the input code into a variable length code, sends the variable length code obtained by the conversion in the memory to an output signal line F of K bits starting from a bit position next to a bit position indicated by an output value c of a first flip-flop 6 to be described later, and sends an overflow portion of the variable length code to an overflow signal line G. In the meantime, the input code is converted into a bit number of the variable length code corresponding to the input code by a converter 8b, and the result of this conversion is supplied to an adder 5 having a modulo of K. This adder 5 adds the value of the output of the converter 8b to the value of the output c from the first flip-flop 6 and delivers the result of this addition to the first flip-flop 6 to effect delay by one time slot. When there occurs a carry, the adder 5 produces a carry signal d and delivers it to a switching circuit 10 and a NAND circuit 7. The output value c of the first flip-flop 6 is delivered to the code converter 8a and the adder 5. The adder 5, accordingly, adds the bit number of the variable length code corresponding to the input code to the output value of the flip-flop 6, and sends the resultant sum to the first flip-flop 6 for storage for 1 time slot. In the next time slot, the adder 5 adds a new input value to the stored value.

The output signal line F is connected to one input terminal of an OR circuit 9. The other input terminal of the OR circuit 9 is used for reception of an output h from a second flip-flop 11 to be described later. An output signal i of the OR circuit 9 is delivered to a third flip-flop 12 of parallel K bits and the switching circuit 10. To the remaining input terminal of the switching circuit 10 is connected to the overflow signal line G. When the carry signal d of the adder 5 is "0", the switching circuit 10 selectively delivers the output signal i of the OR circuit 9. When the signal d is "1", it selectively delivers the overflow signal g on the overflow signal line G to the second flip-flop 11. In other words, an overflow signal g is selectively delivered when the variable length code converter 8a produces an overflow and the output signal i of the OR circuit 9 is selectively delivered as an output signal k when the code converter 8a produces no overflow. The second flip-flop 11 delays the input signal k by 1 time slot and, at the rise of the subsequent clock pulse b, delivers the delayed signal to the OR circuit 9. The output signal i of the OR circuit 9, therefore, is the logical sum of the output code, f, of the converting circuit 8a and the output code h of the second flip-flop 11. This signal i is applied to the third flip-flop 12 for storage, and the content of this storage is parallelly delivered out every K bits to an output terminal 13 at the edge of the output signal e of the NAND circuit 7 rising from "0" to "1". Applied to one input terminal of the NAND circuit 7 is the carry signal d from the adder 5. At the other input terminal, a signal produced by the inversion of the clock pulse b in an inverter circuit 3 is received. The output from the NAND circuit 7, therefore, is "1" in the absence of the carry signal d. During a time clock in which the carry signal d is "1", the output becomes "0" after the clock pulse b disappears in the latter half of the duration. By the next clock pulse, the output is caused to assume "1" (see FIG. 2C). As the result, the content of memory in the third flip-flop 12 is parallelly delivered out as an output signal j through the terminal 13 at the time clock following the change of the value of the carry signal d to "1". From a clock output terminal 14, there is issued the clock pulse e synchronized with the output signal j. In this manner, the input code is converted into a variable length code train and this train of variable length code is delivered out every K bits sequentially and parallelly, thereby producing the output signal j.

The variable length code converter 8a, the converter 8b, the adder 5 may be constructed integrally by PROM, for example, to permit simplification of hardware. The flip-flops 6, 11 and 12 may be formed by using D type flip-flops which are available on the market. The driving circuits for the various flip-flops which are formed by the inverting circuits 3, 4 and the NAND circuit 7 are not limited to those indicated in the preceding embodiment but may be easily modified in various forms.

Now, the operation of the present embodiment will be described below. For the sake of simplicity, the following description will be made on the assumption that the input code a is a three bit/one word fixed length code and corresponds to a variable length code as illustrated in Table 1.

TABLE 1

| Input code | Variable length code | Code length (L) |
|---|---|---|
| 000 | 1 | 1 |
| 001 | 010 | 3 |
| 010 | 011 | 3 |
| 011 | 0010 | 4 |
| 100 | 0011 | 4 |
| 101 | 00010 | 5 |
| 110 | 00011 | 5 |
| 111 | 00001 | 5 |

It is further assumed that the bit number K is 5 and a 5-bit parallel code is delivered out of the output terminal 13. If the input code a in the first time slot is "010", for example, then it is converted by the memory incorporated in the code converter 8a into a variable length code "011". By the converter 8b, the input code "010" is converted to the corresponding length of variable code, i.e., "3" and the result of this conversion is delivered to the adder 5 having the modulo of K (=5). At this time, since the output of the first flip-flop 6 is still "0", the output of the adder 5 becomes "3", which is stored in the first flip-flop 6. In this phase, the carry signal d of the adder 5 is "0". On the other hand, since the output c of the first flip-flop is "0", the code converter 8a delivers, sequentially and parallelly, the variable length code "011" converted by the built-in memory, starting from the first bit position of the five-bit output signal line F. This means that the signal f on the signal line F is "01100". Since there is no overflow, the overflow signal g on the overflow signal line G is "0". since the output h of the second flip-flop 11 is still "0", the output signal i of the OR circuit becomes "01100". Since the carry signal d is "0", the switching circuit 10 selects the signal i and delivers it out. The output signal k from the switching circuit 10 is stored in the second flip-flop 11. The various signals involved in the first time slot as described above are shown in Table 2. In Table 2, part of the logical state "0" is expressed by "--" characters to facilitate comprehension of the description.

TABLE 2

| | (First time slot) |
|---|---|
| a | 010 |
| c | 0 (by decimal notation) |
| d | 0 |
| f | 011-- |
| g | ----- |
| h | ----- |
| i (f + h) | 011-- |
| j | 00000 |
| k (i or g) | 011-- |

Similarly, the states of various signals involved in the second through seventh time slots are shown in Tables 3 through 8, respectively.

TABLE 3

| a | 001 |
|---|---|
| c | 3 |
| d | 1 |
| f | ---01 |
| g | 0---- |
| h | 011-- |
| i | 01101 |
| j | — |
| k | 0---- |

TABLE 4

| a | 000 |
|---|---|
| c | 1 |
| d | 0 |
| f | -1--- |
| g | ----- |
| h | 0---- |
| i | 01--- |
| j | 01101 |
| k | 01--- |

TABLE 5

| a | 000 |
|---|---|
| c | 2 |
| d | 0 |
| f | --1-- |
| g | ----- |
| h | 01--- |
| i | 011-- |
| j | — |
| k | 011-- |

TABLE 6

| a | 011 |
|---|---|
| c | 3 |
| d | 1 |
| f | ---00 |
| g | 10--- |
| h | 011-- |
| i | 01100 |
| j | — |
| k | 10--- |

TABLE 7

| a | 111 |
|---|---|
| c | 2 |
| d | 1 |
| f | --000 |
| g | 01--- |
| h | 10--- |
| i | 10000 |
| j | 01100 |

TABLE 7-continued

| | |
|---|---|
| k | 01--- |

TABLE 8

| | |
|---|---|
| a | 010 |
| c | 2 |
| d | 1 |
| f | --011 |
| g | ----- |
| h | 01--- |
| i | 01011 |
| j | 10000 |
| k | ----- |

For example, during the second time slot, the output signal c from the first flip-flop 6 is "3" and the output signal h from the second flip-flop 11 is "01100" as shown in Table 3. They respectively equal the value of the output from the adder 5 and the output value k from the switching circuit 10 during the first time slot. For the input fixed length code a "001", therefore, the adder 5 adds the value 3 of the output from the converter 8b to the signal c (namely "3"), sets the carry signal d to "1", and delivers 1=6−Mod (5) (the difference, 6−5=1) as an input to the first flip-flop 6. The memory built in the code converter 8a converts the input code "001" to the variable length code "010". Since the signal c is "3", the code converter 8a sets the fourth bit and the fifth bit of the signal line F to "0" and "1", respectively. The signal f, consequently, becomes "00001". Since the last code "0" of the variable length code "010" overflows, the overflowing signal is delivered to the first bit of the signal line G. The signal g, therefore, becomes "00000". Since the signal d is "1", the switching circuit 10 selects the signal g and delivers it out as the output signal k. The signal k, therefore, is "00000" (which signal k is stored in the second flip-flop 11 and delivered out as the signal h during the subsequent third time slot). Since the signal h is "01100" and the signal f is "00001", the signal i becomes "01101". The third flip-flop 12 keeps this signal i in storage. Since the signal d is "1", the output from the NAND circuit falls to a low level when the output signal from the inverting circuit 3 rises to a high level during the latter half of the second time slot (see FIG. 2). The logical states of the clock pulse b, the carry signal d, and the signal e during the first through seventh time slots are shown respectively by the time charts of FIGS. 2A, 2B and 2C. Since the flip-flop 12 is so constructed as to deliver the memorized content in the form of a parallel signal j of five bits during the rise of the signal e, the signal j is not delivered out during the second time slot.

In the third time slot, because of a similar operation, signals at the various portions become as shown in Table 4. To be specific, the signal e becomes "1", the variable length code "1" converted from the input code "000" is delivered to the second bit position on the signal line F, and the signal f becomes "01000". Since there is no overflow, the overflow signal g becomes "0". The adder 5 adds the bit length 1 of the variable length code "1" to the output value 1 from the first flip-flop 6 (the value stored during the second time slot) and the result of the addition, 2, is newly stored in the first flip-flop 6. The carry signal d is at a low level. The switching circuit 10, therefore, selects the signal i and delivers it out as the output signal k to the second flip-flop 11. Since the signal f is "01000" and the signal h is "00000" (identical with the signal k in the second time slot), the signal i becomes "01000". The signal k, accordingly, becomes "01000". Since the signal e falls to the low level during the latter half of the second time slot as shown in FIG. 2C, the edge of the rise of the signal e in the third time slot causes the third flip-flop 12 to deliver the stored content "01101" in the form of a parallel output j through the terminal 13. In the same manner, the signals at the various portions in the fourth and fifth time slots are as shown in Tables 5 and 6 respectively. During these time slots, the third flip-flop 12 produces no new output because there is no rise of the signal e.

In the sixth time slot, the value stored in the third flip-flop 12 is delivered at the time that the signal e rises as shown in FIG. 2C. The value j of the output produced in this case is "01100" (identical with the signal i in the fifth time slot). Similarly, the output "1000" is produced in the seventh time slot. In the seventh time slot, the signal i "01011" is stored in the third flip-flop 12. In the subsequent eighth time slot, the signal j is delivered out as "01011". The input train of three bit-/one word fixed length codes "010", "001", "000", "000", "011", "111" and "010" is converted into a train of variable length codes "011", "010", "1", "1", "0010", "00001" and "011" and the variable length code is converted into a train of 5-bit parallel output codes "01101", "01100", "10000", and "01011" and delivered out. The parallel output codes thus converted every five bits, therefore, can be transmitted as PCM signals, for example. At the receiving station, the fixed length code a can be reproduced from the train of codes to be received every five bits.

As described above, in accordance with this invention, the circuit is constructed so that the fixed length code received as input is converted into the variable length code and sent onto the output signal line of K bits starting from the bit position next to that involved in the preceding time slot, the logical sum of this output and the code delivered out previously is stored in the second and third flip-flops, and when there occurs an oveflow, the content stored in the third flip-flop is delivered out in the form of a parallel output signal of K bits during the subsequent time slot and, at the same time, the overflowing portion of the variable length code is supplied to the second flip-flop and, in the further subsequent time slot, the variable length code is supplied starting from the bit position subsequent to the variable length code stored in the second flip-flop. Thus, the circuit is capable of converting a train of input fixed length codes into a train of variable length codes and delivering out the converted codes in the form of parallel output codes of K bits. Since the configuration of the circuit described above can be obtained such as with simple PROM and D type flip-flops, this invention provides a simple code converting circuit. This invention, therefore, has an effect of drastically lowering the transfer bit rate of signals of a wide bandwidth such as video signals.

What is claimed is:

1. A code converting circuit for conversion of digital signals of first length codes into second length codes comprising:

converting means for converting an input first length code into a second length code;

means including first memory means for storage of information concerning a bit number of the second length code, for causing the converting means to send the second length code to an output signal line of K bits, starting from a bit position next to that of a different second length code in the preceding time slot;

second memory means for storage of a logical sum of the previously sent second length code;

third memory means for storage of the presently sent second length code;

means for causing the content stored in the third memory means to be delivered out in the form of a parallel output signal of K bits during the subsequent time slot when the second length code overflows, and supplying the overflowing portion of the second length code to the second memory means; and means for causing the second length code to be sent from said converting means during the further subsequent time slot, starting from a bit position next to the second length code stored in the second memory means.

2. A code converting circuit for converting digital signals of first length codes into second length codes and delivering a train of second length codes produced by the conversion parallelly every predetermined K bits, said converting circuit comprising:

a variable length code converter for converting an input first length code into a second length code, sending the second length code to an output signal line of K bits starting from a bit position next to that indicated by the output value of a first flip-flop, and sending an overflowing portion of said second length code to an overflow signal line;

an adder with a modulo of K for adding the bit number of the second length code corresponding to the input first length code to the output value of the first flip-flop, said first flip-flop functioning to delay the output value of said adder by one time slot and delivering the delayed output to said variable length code converter and said adder;

an OR circuit for receiving the output from the output signal line of said variable length code converter and the output from a second flip-flop;

a switching circuit receiving the output signal of said OR circuit and the overflow signal from said variable length code converter and being responsive to a carry signal of said adder to selectively deliver as an output thereof one of the input signals, said second flip-flop functioning to delay the output signal of said switching circuit by one time slot and delivering the delayed output signal to said OR circuit; and a third flip-flop for storing the output signal of said OR circuit and delivering said stored value during the rise of the time slot following the delivery of the carry signal of said adder.

* * * * *